United States Patent
Asam et al.

(10) Patent No.: US 9,438,221 B2
(45) Date of Patent: Sep. 6, 2016

(54) SWITCH DEVICE

(71) Applicant: Infineon Technologies AG, Neubiberg (DE)

(72) Inventors: Michael Asam, Sainbach (DE); Veli Kartal, Munich (DE)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 14/244,336

(22) Filed: Apr. 3, 2014

(65) Prior Publication Data

US 2015/0288349 A1    Oct. 8, 2015

(51) Int. Cl.
   *H03K 3/356*    (2006.01)
   *H03K 17/12*    (2006.01)
   *H03K 17/06*    (2006.01)

(52) U.S. Cl.
   CPC .......... *H03K 17/122* (2013.01); *H03K 17/063* (2013.01); *H03K 2217/0027* (2013.01)

(58) Field of Classification Search
   None
   See application file for complete search history.

(56) References Cited

U.S. PATENT DOCUMENTS

2010/0079120 A1*   4/2010   Arndt ................ H01L 29/7803
                                                      323/269

OTHER PUBLICATIONS

"SPI Power Controller, SPOC-BTS6480SF, for Advanced Front Light Control," infineon Data Sheet Rev. 1.0, Apr. 12, 2010, 73 pp.

* cited by examiner

*Primary Examiner* — Lincoln Donovan
*Assistant Examiner* — Khareem E Almo
(74) *Attorney, Agent, or Firm* — Shumaker & Sieffert, P.A.

(57) ABSTRACT

Switch devices with a first switching path and a second switching path are provided in some embodiments. When a voltage drop across the first switching path exceeds a predetermined voltage, the second switch may be activated.

20 Claims, 4 Drawing Sheets

SWITCH DEVICE

TECHNICAL FIELD

The present application relates to switch devices and corresponding methods for operating switch devices.

BACKGROUND

For switching of high load currents switch devices, for example based on metal oxide semiconductor (MOS) transistors, are used in some applications. For many applications, it is desirable that a resistance of the switch device in a switched-on state (i.e. a state where the switch device is conducting) is as low as possible to reduce power dissipation in the switch device.

In some applications, it is required to be able to measure the load current flowing via the switch device. For some applications, a high dynamic range from low load currents to high load currents may be required. To determine the load current, in some applications a voltage drop across the switch device is measured. For example, in case of a MOS transistor being used as a switch device, a drain-source voltage may be directly or indirectly measured to obtain a measure for the load current. However, in case of a low-ohmic switch device, i.e. a switch device having a low resistance value when switched on, for low load currents the voltage drop across the switch device becomes very small, which may lead to inaccuracies in the measurement.

In some conventional approaches using a switch transistor like a MOS transistor or switch device, for measuring a load current via the switch transistor a measurement transistor which is scaled with respect to the switch transistor may be used. In some approaches, a drain-source voltage of this further transistor is regulated to correspond to the drain-source voltage of the switch transistor. In such a case, a current through the measurement transistor is scaled with respect to the load current corresponding to the scaling factor between the transistors. However, even in such a circuit the regulating of the drain-source voltage of the measurement transistor to the drain-source voltage of the switch transistor has inaccuracies, which may become more pronounced for small load currents in case the switch transistor has a low resistance. On the other hand, as mentioned above, switch devices having a low resistance are generally desirable to reduce power dissipation.

DETAILED DESCRIPTION

Various illustrative embodiments will be discussed in the following referring to the attached drawings. These embodiments are not to be construed as limiting the scope of the present application, but are to be seen merely as illustrative examples. For example, while an embodiment may be described as comprising a plurality of features or elements, in other embodiments some of these features or elements may be omitted and/or replaced by alternative features. In yet other embodiments, additional features or elements may be present.

Moreover, features or elements from different embodiments may be combined with each other to form further embodiments unless specifically noted otherwise.

Any connection or coupling described herein may be direct, i.e. without intervening elements, or indirect, i.e. with one or more intervening elements, as long as the general function of the connection or coupling, e.g. to transmit a certain kind of information is not significantly altered.

In embodiments, switching devices will be discussed. A switch device generally is an entity which may close an electric connection such that current may flow or open an electric connection so that essentially no current flows. In other words, the switch device may change between a low-ohmic state to allow current to flow and a high-ohmic state where essentially no current flows. Depending on the implementation of the switch device, some current may still flow in the high-ohmic state due to undesired effects like leakage etc.

Generally, in the terminology used herein a switch (or switch device) is "closed" or "on" when current may flow via the switch, while it is described as being "open" or "off" when essentially no current may flow. Switches may for example be implemented using transistors like MOS transistors. In case of a MOS transistor, when the switch is closed current may flow between source and drain with a comparatively low resistance, whereas in the open or off state apart from leakage currents and similar effects essentially no current may flow between source and drain.

In some embodiments, a switch device may comprise a first switching path and a second switching path. A resistance of the first switching path in a closed state may be higher than a resistance of the second switching path in a closed state. For sensing low load currents, in some embodiments only the first switching path may be activated, which in some embodiments through the provision of a higher resistance facilitates measurement of low currents. In case of higher currents, the second switching path may be activated to provide a smaller resistance and therefore reduce power dissipation in some embodiments. Additionally, the second switching path may also be activated to prevent an overload on the first switching path.

An activation mechanism for such an overload protection of the first switching path may be different from a regular activation mechanism for the second switching path.

When the second switching path is closed, the first switching path may remain closed to provide for example two parallel closed switching paths. In other embodiments, the first switching path may be opened when the second switching path is closed.

Figure 1:
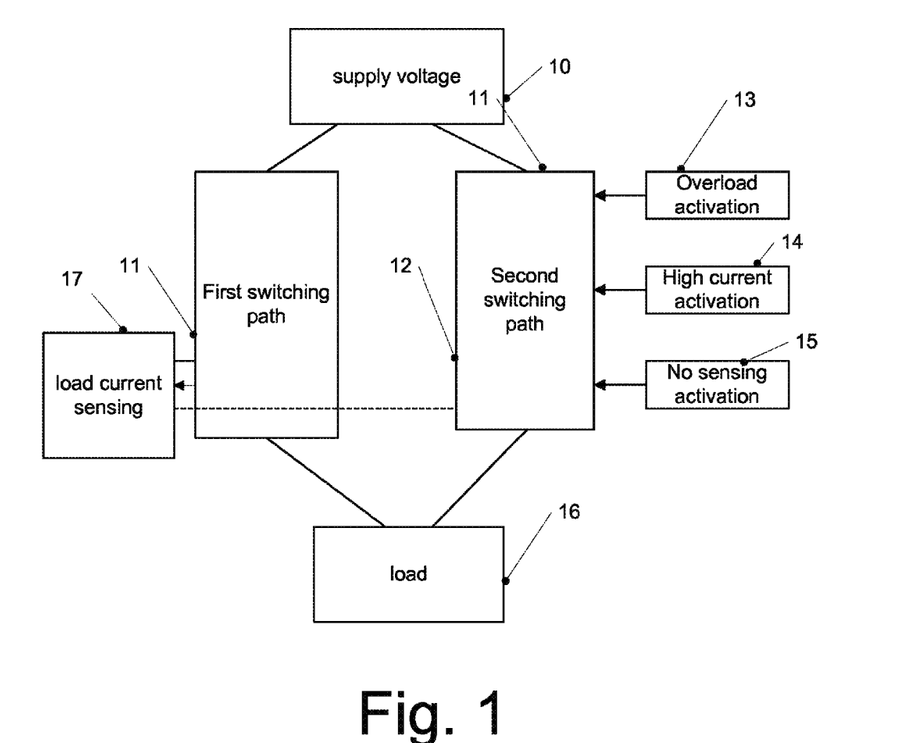
FIG. 1 is a block diagram illustrating a switch device according to an embodiment.

In FIG. 1, a switch device according to an embodiment is schematically illustrated. In the embodiment of FIG. 1, the switch device comprises a first switching path 11 and a second switching path 12 coupled in parallel to each other between a supply voltage 10 and a load 16. Therefore, the switch device of FIG. 1 may be used to selectively connect load 16 to supply voltage 10. In some embodiments, supply voltage 10 may be a positive supply voltage. In this case, the switch device of FIG. 1 may also be referred to as a high side switch. In other embodiments, supply voltage 10 may be a negative supply voltage. In this case, the switch device of FIG. 1 may also be referred to as a low side switch.

Load 16 may represent any kind of device or circuitry to be selectively supplied by supply voltage 10 via first and second switching paths 11, 12.

In embodiments, first switching path 11 in a closed state has a higher resistance than second switching path 12. In other words, first switching path 11 may be a relatively higher ohmic switching path, and second switching path 12 may be a relatively lower ohmic switching path. For example, in embodiments a resistance of first switching path 11 in a closed state may be between 10Ω and 100Ω, for example about 50Ω, and a resistance of second switching path 12 when closed may be between 0.1 mΩ and 100 mΩ, for example around 1 mΩ. For example, a resistance of the first switching path in a closed state may be 100-10000 times the resistance of the second switching path in a closed state, e.g. 5000 times. However, these numerical values are given merely for illustrative purposes and are not to be construed as limiting.

In an embodiment, a load current sensing circuit 17 may be coupled to first switching path. As first switching path 11 has a comparatively high resistance, even at low load currents a voltage drop across first switching path 11 may be relatively high due to the comparatively high resistance. Such a comparatively high voltage drop may be easier to measure with a required accuracy than a smaller voltage drop.

In embodiments, when low load currents are to be measured, only first switching path 11 is activated, i.e. closed. Second switching path 12 in various embodiments may be activated in various circumstances, as indicated by boxes 13-15. For example, when the load current increases (which may be due to a lower load resistance, due to short circuits or other events), second switching path 12 is activated. In this case, the power dissipation in particular at higher currents may be reduced, as the resistance of second switching path 12 is smaller.

In some embodiments, as indicated by a dashed line load current sensing circuit 17 may also be coupled to second switching path 12, such that for example higher load currents may be measured by measuring a voltage drop across second switching path 12. Even if the resistance of second switching path is lower, when the load current is high the voltage drop may be sufficiently high to perform a measurement with a desired accuracy.

Furthermore, in some embodiments it may only be necessary to measure the load current sometimes, for example at certain intervals. As indicated by a box 15, outside the times where the load current is to be measured second switching path 12 may be closed to reduce power dissipation. In other words, in some embodiments first switching path 11 may only be activated alone if a load current is to be measured, or in case load current sensing circuit 17 is also coupled to second switching path 12 only when a low load current is to be measured.

Furthermore, in the embodiment of FIG. 1 an overload activation 13 may be provided which closes second switching path 12 to provide overloading of first switching path 11, e.g. in case of high load currents. Such high load currents due to the comparatively high resistance of first switching path 11 could in some circumstances lead to a high power dissipation, heating of elements of the first switching path 11 and possibly damaging of these elements. For example, overload activation 13 may be triggered when a voltage drop across first switching path 11 reaches a predetermined threshold value. Overload activation 13 may use a mechanism different from an activation mechanism used for the high current activation of box 14 and the activation of box 15 in case no current sensing is to be performed. For example, overload activation 13 may provide a faster activation of the second switching path in case of overload. It should be noted that boxes 13-15 are depicted separate from second switching path 12, but one or more of the functions represented by boxes 13-15 may also be incorporated fully or partially in second switching path 12. For example, an overload activation may be implemented by configuring and coupling a transistor used as a switch in second switching path 12 in an appropriate manner, as will be explained later in more detail.

Figure 2:
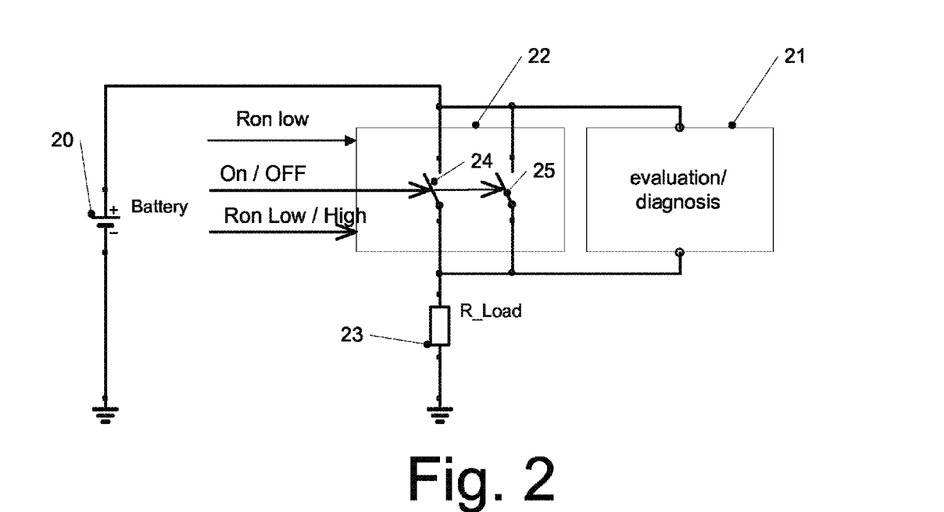
FIG. 2 is a schematic circuit diagram illustrating a switch device according to a further embodiment.

In FIG. 2, a further embodiment of a switch device 22 according to an embodiment is shown. Switch device 22, as illustratively represented by a switch 24, may be used to selectively connect a battery 20 to a load 23 represented by a resistor having a resistance R_Load. Switching device 22 may have a first mode of operation where a resistance in a closed state, also referred to as Ron, is low, and a second mode of operation where Ron is high.

For example, to achieve this a first switching path and a second switching path as illustrated with respect to FIG. 1 may be provided. As indicated by an arrow in FIG. 2, switch device 22 may be switched on and off, for example by closing switch 24 or opening switch 24, to selectively connect battery 20 to load 23.

Moreover, as indicated by a further arrow, the resistance Ron may be selected to be low or high. For example, a low Ron may be selected in case a high load current is flowing or no measurement of the load current has to be performed in order to limit power dissipation. Furthermore, as indicated by a further arrow switch device 22 may be switched to the mode of operation with low Ron in case a high power dissipation in the mode with high Ron threatens to become critical, for example cause excessive heating or threaten to damage or destroy switch device 22 or part thereof.

This may form an overload protection mechanism which may be independent from the changing between low and high Ron in other circumstances, for example the change between low and high Ron mentioned above for measuring low load currents or for obtaining a low power dissipation.

Furthermore, optionally the embodiment of FIG. 2 may comprise an evaluation/diagnosis circuit 21. Evaluation/diagnosis circuit 21 may for example measure a load current by measuring a voltage drop across switch device 22 and/or may control switching between the modes of operation with low Ron and the mode of operation with high Ron. For example, evaluation/diagnosis circuit 21 may switch switch device to the mode of operation with high Ron in case a low load current is to be measured, or generally in case of low load currents, or generally for measuring load currents, and may switch switch 22 to the mode of operation with low Ron in case of higher load currents and/or no load current is to be measured.

Figure 3:
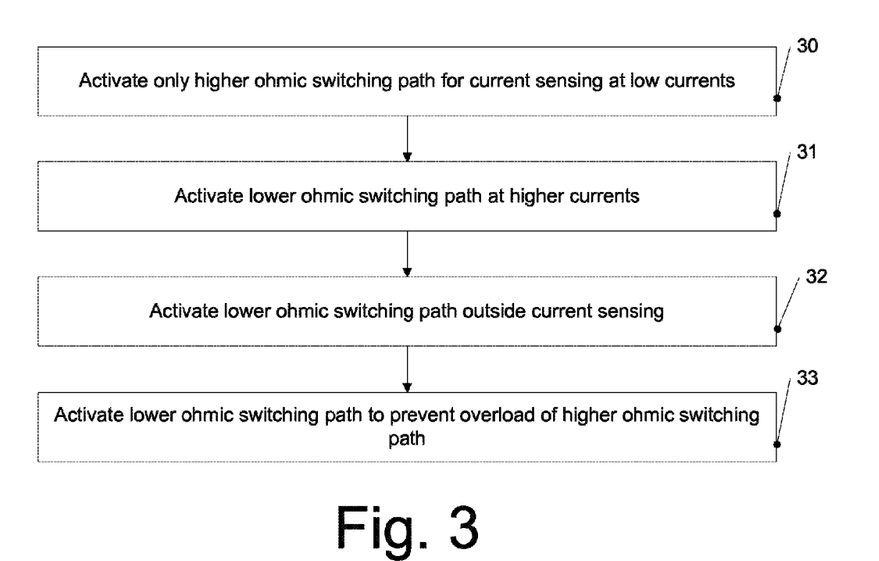
FIG. 3 is a flowchart illustrating a method according to an embodiment.

In FIG. 3, a flowchart illustrating a method according to an embodiment is shown. The method of FIG. 3 may for example be implemented using the switch device of the embodiment of FIG. 1 or 2 or any of the embodiments described in the following, but may also be used independently therefrom.

While the method is depicted as a series of acts or events in FIG. 3 in a certain order, it should be noted that the order these acts or events are illustrated is not to be construed as limiting. In particular, in the embodiment of FIG. 3 the various acts or events described at 30, 31, 32 and 33 in FIG. 3 may be performed in any order, and any of these acts or events may be performed several times during operation of a switch device. Furthermore, some of the acts or events also may be omitted in some embodiments.

At 30, only a higher ohmic switching path of two switching paths of a switch device is activated, for example for current sensing at low currents. At 31, additionally or alternatively to the higher ohmic switching path a lower ohmic switching path is activated at higher currents. At 32, outside a time needed for current sensing the lower ohmic switching path may optionally be also activated for low currents. Furthermore, at 33 the lower ohmic switching path may be activated to prevent an overload of the higher ohmic switching path due to high current, for example to prevent excessive power dissipation and heating associated with the power dissipation. It should be noted that the activating at 33 may use a different activation mechanism than the activating at 31 or 32. For example, the activating at 33 may have a lower response time and may be performed automatically without involvement of a control signal, while the activating at 31 and 32 may be controlled by a control signal.

It should be noted that the method illustrated and explained with respect to FIG. 3 is merely one example for a method usable for operating a switch device, and depending on the switch device used other methods may apply as well. For example, for operating the embodiment of FIG. 2, Ron may be set to a high value for current sensing at low currents, and for example set to a low value at higher currents or outside current sensing. Additionally, Ron may be set to the low value through a different mechanism as an overload protection. In other embodiments, yet other methods may be used.

Figure 4:
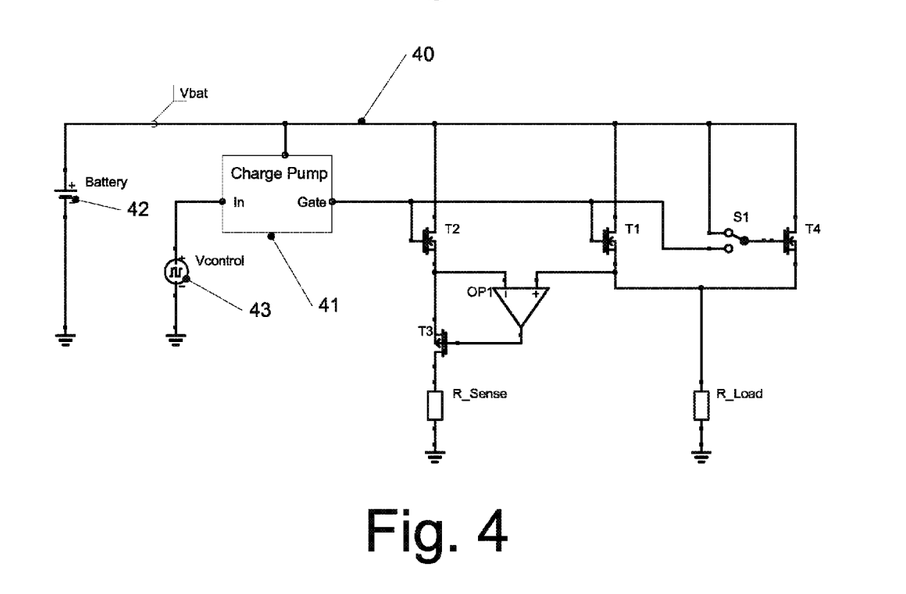
FIG. 4 is a circuit diagram illustrating a switch device according to a further embodiment.

In FIG. 4, a circuit diagram illustrating a switch device according to an embodiment together with further components is shown. The switch device of FIG. 4 comprises a first switch transistor T1 and a second switch transistor T4. In the embodiment of FIG. 4, transistors T1 and T2 are NMOS transistors. However, other kinds of transistors may be used as well. In the embodiment of FIG. 4, a gate terminal of transistor T1 is coupled with an output (labeled "gate" in FIG. 4) of a charge pump 41. Furthermore, a gate terminal of transistor T4 is coupled to the output of charge pump 41 via a switch S1. In a first state, switch S1 as mentioned connects the gate terminal of transistor T4 with the output of charge pump 41. In a second position (the position shown in FIG. 4), switch S1 connects the gate terminal of transistor T4 with a drain terminal of transistor T4.

Charge pump 41 has a control input labeled In in FIG. 4 and is supplied by being connected to a voltage rail 40, which is supplied with a voltage Vbat by a battery 42. While a battery is shown as a voltage source in FIG. 4, other voltage sources may be used as well. For example, voltage rail 40 may be coupled to an external mains adaptor, which may be coupled to a power network to supply a desired supply voltage.

In the embodiment of FIG. 4, when transistor T1 is closed, i.e. driven by charge pump 41 to become conducting between its source and drain terminals, it has a higher resistance than transistor T4 when its gate is driven by charge pump 41 to become conducting between source and drain. For example, a resistance of transistor T1 in a closed state may be between 10Ω and 100Ω, for example about 50Ω, and a resistance of transistor T4 may be between 0.1 mΩ and 100 mΩ, for example of the order of 1 mΩ, although other values may also be used. To achieve these different resistances, for example transistor T4 may be scaled with respect to transistor T1, i.e. may have larger dimensions on the chip.

Drain terminals of transistors T1 and T4 are coupled with supply voltage rail 40, and source terminals of transistors T1 and T4 are coupled with a load, represented by a resistor R_Load in FIG. 4. Therefore, by switching transistor T1 and/or T4 via a charge pump 41, resistor R_Load may selectively be coupled to the supply voltage on supply voltage rail 40.

Charge pump 41 may be controlled by a voltage Vcontrol generated by a control signal generator 43 to control the selective coupling.

Furthermore, the embodiment of FIG. 4 comprises a current sensing circuit. The current sensing circuit comprises an NMOS transistor T2, a PMOS transistor T3, an operational amplifier OP1, and a sense resistor R_Sense which are coupled as shown in FIG. 4. Transistor T2 may be scaled by a fixed factor with respect to transistor T1 and/or T4, this fixed factor also being referred to as KILIS-factor. Scaling in the context of this application means reducing dimensions of the transistors like gate length or gate width according to the scaling factor.

In a closed state, i.e. a conducting state, transistor T2 may have a resistance between 50 mΩ and 200 mΩ, for example about 100 mΩ. However, these numerical values serve merely for illustration purposes.

When switch S1 is in the first state, R_Load is coupled with supply voltage rail 40 both via T1 and via T4. In this case, as T4 has a lower resistance, at least most of the current will flow via T4, causing little power dissipation. On the other hand, when switch S1 is in the second state (the state shown in FIG. 4), at least for low currents only transistor T1 is closed, and current flows only via transistor T1. As T1 has a comparatively high resistance in its closed state, a voltage drop across T1 is comparatively high at low currents, which make it easier to use this voltage drop as a measure for the current flowing to resistor R_Load with a desired precision.

Operation of the current sensing circuit in the embodiment of FIG. 4 is as follows:

A positive input of operational amplifier OP1 is coupled with a source terminal of T1, and a negative input of operational amplifier OP1 is coupled with a source terminal of transistor T2. An output of operational amplifier OP1 is coupled with a gate terminal of PMOS transistor T3. This arrangement controls a drain-source voltage of transistor T2 such that it corresponds to a drain-source voltage of T1. In case transistor T4 is closed, the drain-source voltage of T1 corresponds to the drain-source voltage of T4 and is essentially determined by the lower resistance of T4. In case the transistor T4 is open, the drain-source voltage of T1 is determined by a load current flowing through R_Load and the resistance value of T1. With this arrangement, the current through T2 corresponds to the load current scaled by the above-mentioned KILIS-factor.

This current is supplied to a resistor R_Sense which has a predefined value. The voltage drop across R_Sense is proportional to the current through T2 and therefore, via the KILIS-factor, proportional to the load current through R_Load. This voltage drop then may for example be evaluated by a microcontroller (not shown in FIG. 4). For example, terminals of R_Sense may be coupled with terminals of such a microcontroller.

To reduce errors in this current measurement, operational amplifier OP1 may for example be provided with a conventional offset compensation, and the measurement circuit discussed may be calibrated.

Therefore, in the embodiment of FIG. 4, through providing T1 and T2 as two switches, low load currents may be sensed with sufficient accuracy in some embodiments, while for high currents T4 may additionally be activated (i.e. switched on) to reduce power dissipation.

Control of S1 may for example be performed based on the load current measured via R_Sense, or a switching may be performed periodically to measure the load current.

Furthermore, the embodiment of FIG. 4 comprises a safety mechanism to prevent overload of T1. This will be explained in the following:

In the mode of operation where switch S1 is in the second state (as shown in FIG. 4), only transistor T1 is turned on via charge pump 41, whereas transistor T4 is inactive. As long as the load current is low, for example due to R_Load having a comparatively high value, the voltage drop via transistor T1 is comparatively low. Therefore, a gate-source voltage of transistor T4 is near 0, as the gate-source voltage of T4 corresponds to the drain-source voltage of T1, i.e. the voltage drop across T1, as the gate of transistor T4 is coupled with the drain of transistor T1 and the source terminals of transistors T1 and T4 are coupled with each other as shown in FIG. 4.

When now, for example caused by a short circuit or a sudden additional requirement for load current, the load current through R_Load increases rapidly, the drain-source voltage of transistor T1 increases accordingly. Therefore, also the corresponding gate-source voltage of transistor T4 increases. When the gate-source voltage of T4 exceeds the threshold voltage of transistor T4, transistor T4 is turned on, providing a lower ohmic path for the increased load current. Therefore, with this mechanism the source-drain voltage of T1 is essentially limited to the threshold voltage of T4.

In some embodiments, when a state where the drain-source voltage of T1 is above the threshold voltage of T4 is detected and therefore T4 becomes conducting, this state may be detected, for example by monitoring the current via R_Sense, or other means for measuring the drain-source voltage of T1, and switch S1 may be set to the first state accordingly to turn T4 fully on irrespective of the voltage. It should be noted that this safety mechanism in embodiments is faster than merely turning T4 on via switch S1, as charging a gate of T4 via charge pump 41 may take some time. Therefore, by configuring T4 in the way shown in FIG. 4, i.e. with its drain and gate terminal coupled with each other and with the drain terminal of T1 when switch S1 is in the second state, a safety mechanism protecting against overload of T1 (and T2) is provided. This may be seen as an example for the overload activation 13 of FIG. 1, which uses a different mechanism than the turning on of transistor T4 via switch S1.

Next, with reference to FIGS. 5-8, additional embodiments will be described. These additional embodiments are based on the embodiment of FIG. 4, and corresponding parts bear the same reference numeral as in FIG. 4 and will not be described again. In other words, for the embodiments of FIGS. 5-8 only the differences compared to the embodiment of FIG. 4 will be described. The various additions and variations discussed with reference to FIGS. 5-8 may be implemented in separate embodiments as shown, but may also be combined to form further embodiments.

Figure 5:
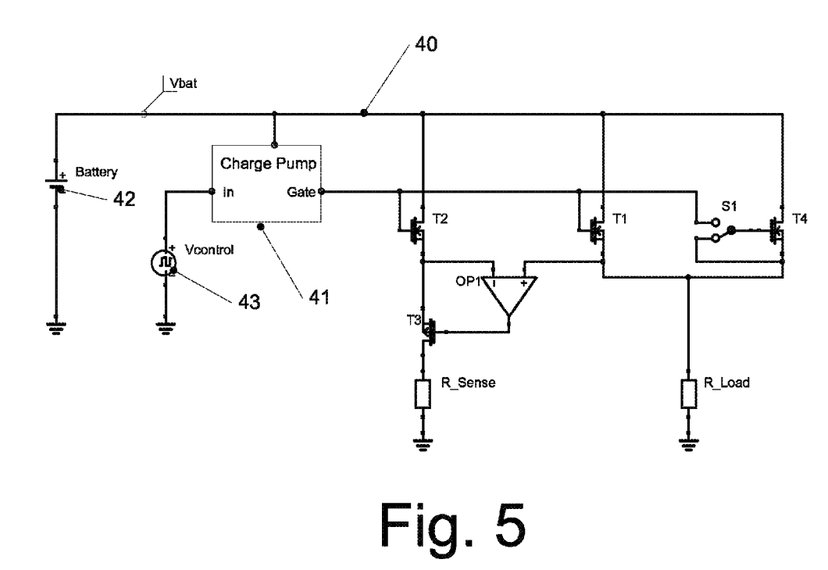
FIG. 5 is a circuit diagram illustrating a switch device according to a further embodiment.

In the embodiment of FIG. 5, in the second state of S1 where transistor T4 is deactivated (corresponding to the state shown in FIG. 5), gate and source of T4 are connected (in contrast to the connection between gate and drain of T4 in the embodiment of FIG. 4). Therefore, in FIG. 5 compared to FIG. 4 the "automatic" activation of T4 as soon as a source-drain voltage of T1 reaches a threshold voltage of T4 is not present in FIG. 5. In such an embodiment, the drain-source voltage of T1 may e.g. be monitored using a separate circuit (not shown), and switch S1 may be switched to the first state turning T4 on when the drain-source voltage over T1 reaches a predetermined value, for example a critical value as regards power dissipation in T1 (and T2).

Figure 6:
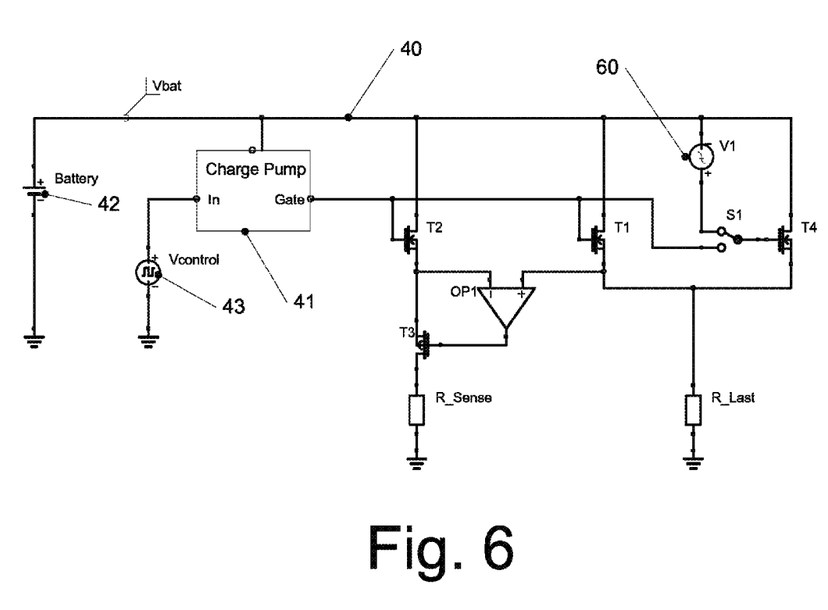
FIG. 6 is a circuit diagram illustrating a switch device according to a further embodiment.

In the embodiment of FIG. 6, in the second state of switch S1 similar to FIG. 4 gate and drain of T4 are connected (the state shown in FIG. 6, where T4 is turned off). However, in the embodiment of FIG. 6 the gate voltage of T4 in this case may be additionally varied as illustratively indicated by a voltage source 60, which adds or subtracts a voltage V1 to or from the gate voltage of T4. V1 may be fixed or adjustable.

By adjusting V1, the limiting of the drain-source voltage of T1 to the threshold voltage of T4 may be modified. In other words, the point where transistor T4 turns on when the drain-source voltage of T1 increases may be adjusted.

The voltage modification represented by voltage source 60 may be independent from charge pump 41. Furthermore, in some embodiments the voltage V1 may be a regulated voltage, for example regulated via a control loop. For example, V1 may be controlled such that a maximum sense current through T2 does not exceed a predetermined value while S1 is in the second state deactivating T4. Also a regulation based on a maximum power dissipation may be used, or the power dissipation in T1 may be controlled dynamically. In other embodiments, additionally or alternatively V1 may be controlled based on temperature. For example, when the temperature is already high V1 may be adjusted to cause an earlier turning on of T4 to prevent further heating by power dissipation. Other desired control mechanisms may be used as well.

Figure 7:
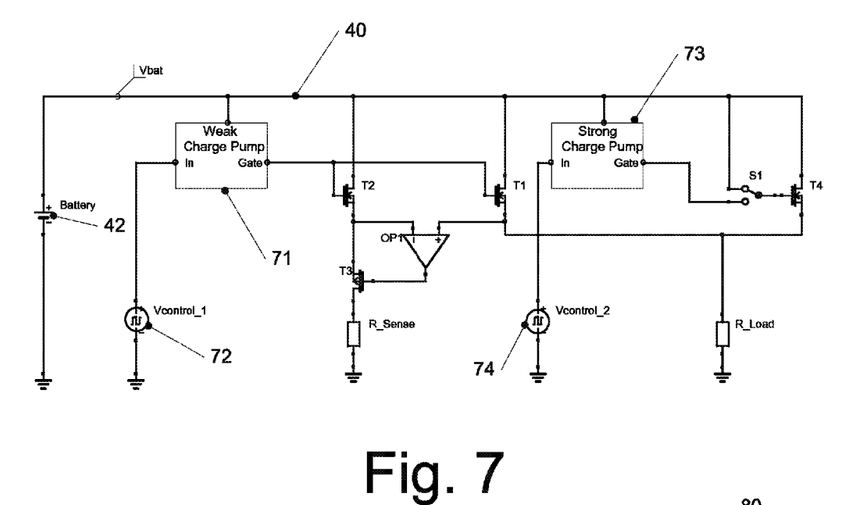
FIG. 7 is a circuit diagram illustrating a switch device according to a further embodiment.

A further embodiment is shown in FIG. 7. In the embodiments of FIGS. 4-6, in the first state of S1 where T4 is turned on the gate terminals of T1 and T4 are driven by charge pump 41 and are connected with each other. In the embodiment of FIG. 7, the gate terminals of T1 and T4 are driven by different charge pumps. A first charge pump 71, labeled "weak charge pump", drives gate terminals of transistors T1 and T2 and is controlled by a voltage source 72 via a first control voltage Vcontrol_1. A gate of T4 is driven by a second charge pump 73 when switch S1 is in the first state. Second charge pump 73 is also labeled "strong charge pump" in FIG. 7. Second charge pump 73 is controlled by a voltage source 74 via a second control voltage Vcontrol_2.

In embodiments, the control voltages Vcontrol_1 and Vcontrol_2 may be controlled in a corresponding manner, so as to switch all transistors on or off simultaneously. In other embodiments, independent controls may be used.

With an embodiment as in FIG. 7, in some cases a problem may be avoided which may occur in some implementations when switch S1 is switched from the second state to the first state and the gates of T1 and T4 are connected. In this case, in some implementations it may occur that charge from the gate of T1 is transferred to the gate of T4, which temporarily may turn both transistors off until enough charging current has been supplied by the charge pump. By using separate charge pumps, such a problem may be avoided in some embodiments. Furthermore, the charge pump may be tailored to the respective transistors. As transistor T4 in the embodiment of FIG. 7 is larger to provide a low ohmic connection, second charge pump 73 may be bigger to be able to generate a higher charging current than first charge pump 71 which may be designed smaller, as it only has to charge gates of smaller transistors T1 and T2 (hence the designation "strong charge pump" and "weak charge pump"). Therefore, in such an embodiment the charge pumps may be optimized for the respective transistors they drive. They also may be optimized in terms of power consumption/supply current.

Figure 8:
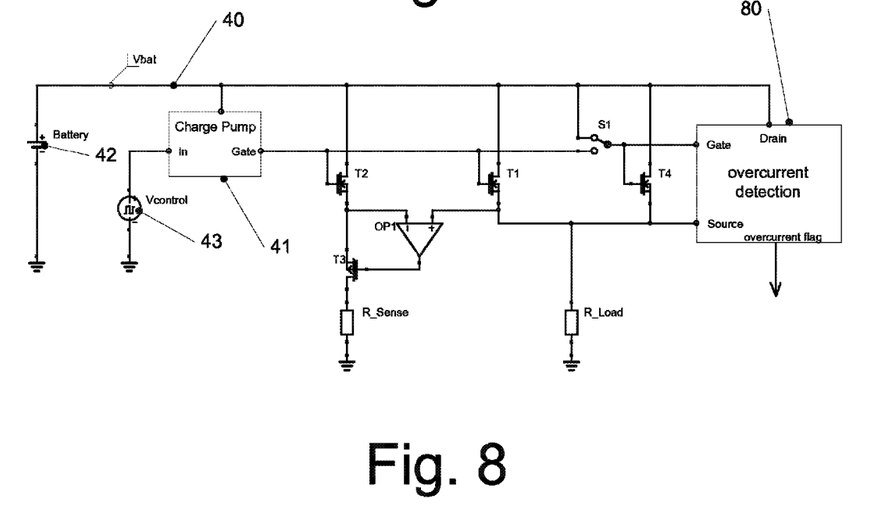
FIG. 8 is a circuit diagram illustrating a switch device according to another embodiment.

A further embodiment is shown in FIG. 8. FIG. 8 again is based on the embodiment of FIG. 4 and additionally comprises an overcurrent detection circuit 80 to detect an overcurrent, for example due to a short circuit to load. To achieve this, gate, source and drain of transistor T4 are monitored, and in case an overcurrent is detected (for example based on a high source-drain voltage of T4) corresponding information is output, for example as an overcurrent flag.

It should be noted that as long as switch S1 is in the second state as shown in FIG. 8 and the load current is low, overcurrent detection 80 is not functioning as it is not connected for example to the gate of T1, which is on. However, through the mechanism discussed with reference to FIG. 4, when the drain-source voltage of transistor T1 exceeds the threshold voltage of T4, T4 is turned on. Therefore, in this case overcurrent detection 80 is connected to gate, drain and source of the turned-on transistors T1 and T4 and may therefore operate normally. As overcurrents lead to an increase of the drain-source voltage of T1 as explained, in case of higher currents overcurrent detection 80 is operative. Overcurrent detection 80 may be implemented in any conventional manner.

As already mentioned, the modifications and variations discussed with reference to FIGS. 5-8 may be combined. For example, in an embodiment both the voltage modification represented by voltage source 60 of FIG. 6 and the first and second charge pumps 71, 73 of FIG. 7 may be implemented, or both the first and second charge pumps of FIG. 7 and overcurrent detection 80 may be implemented, or any other combinations of two or more modifications discussed may be used.

It is to be emphasized again that the discussed embodiments are illustrative only and are not to be construed as limiting the scope of the present application.

What is claimed is:

1. A switch device, comprising:
a first switching path including a first input and a first output,
a second switching path including a second input and a second output,
wherein the first switching path and the second switching path are connected in parallel, the first input and the second input are configured to be connected to a supply voltage, and the first output and the second output are configured to be directly connected to a load,
wherein in a closed state a resistance of the first switching path is greater than a resistance of the second switching path, and
wherein the switch device is configured to turn the second switching path on in response to a voltage drop across the first switching path exceeding a predetermined value.

2. The switch device of claim 1, wherein the switch device is configured to only activate the first switching path when a load current is to be sensed.

3. The switch device of claim 1, wherein the switch device is configured to turn only the first switching path on when a load current below a predetermined threshold is to be sensed.

4. The switch device of claim 1, wherein the switch device is further configured to turn the second switching path on outside times for load current measurements.

5. The switch device of claim 1, further comprising a current sensing circuit coupled with the first switching path.

6. The switch device of claim 5, wherein the current sensing circuit is further coupled with the second switching path.

7. The switch device of claim 1, wherein the first switching path comprises a first transistor, and wherein the second switching path comprises a second transistor, the second transistor being larger than the first transistor.

8. The switch device of claim 7, wherein the first transistor is a MOS transistor, and wherein the second transistor is a MOS transistor,
wherein a drain terminal of the first transistor is to be coupled with the supply voltage, wherein a drain terminal of the second transistor is to be coupled with the supply voltage,
wherein a source terminal of the first transistor is coupled with a source terminal of the second transistor and is to be coupled with the terminal of the load, and wherein a gate terminal of the second transistor in a first mode of operation is coupled with a charge pump and in a second mode of operation is coupled with the drain terminal of the second transistor.

9. The switch device of claim 8, wherein in the first mode of operation the gate terminal of the second transistor is coupled to a gate terminal of the first transistor.

10. The switch device of claim 8, wherein a gate terminal of the first transistor is coupled with a further charge pump.

11. The switch device of claim 8, wherein the drain terminal of the second transistor is coupled with the supply voltage via at least one of a voltage modification device or a voltage modification circuit.

12. The switch device of claim 11, wherein the voltage modification device is regulated depending on at least one of a temperature, a voltage drop across the first transistor or a current through the first transistor.

13. The switch device of claim 7, further comprising an overcurrent detection circuit coupled to the second transistor.

14. A switch device, comprising:
a first mode of operation with a lower resistance in a switched-on state,
a second mode of operation with a higher resistance in a switched-on state,
a switching mechanism to switch between the first mode of operation and the second mode of operation, and
a second switching mechanism different from the first switching mechanism to switch to the first mode of operation in response to an overload in the second mode of operation wherein the overload corresponds to a state causing overheating of an element in the second mode of operation.

15. The switch device of claim 14, further comprising an evaluation/diagnosis circuit configured to measure a current through the switch device.

16. A method, comprising:
activating only a higher ohmic switching path for current sensing at low currents,
activating a lower ohmic switching path at higher currents, and
activating the lower ohmic switching path to prevent an overload using a different activation mechanism than the activating of the lower ohmic switching path at higher currents.

17. The method of claim 16, further comprising activating the lower ohmic switching path outside a current sensing time slot.

18. The method of claim 16, wherein the lower ohmic switching path comprises a first transistor, and wherein the higher ohmic switching path comprises a second transistor, wherein the activating of the lower ohmic switching path to prevent overload of the higher ohmic switching path comprising activating the second transistor when a source-drain voltage of the first transistor corresponds to a threshold voltage of the second transistor.

19. The method of claim 16, wherein the lower ohmic switching path comprises a first transistor, and wherein the higher ohmic switching path comprises a second transistor, wherein the activating of the lower ohmic switching path to prevent overload of the higher ohmic switching path comprising activating the second transistor when a combination of the source-drain voltage of the first transistor with a modification voltage corresponds to a threshold voltage of the second transistor.

20. The method of claim 19, further comprising determining the modification voltage based on at least one of a temperature, a source-drain voltage of the first transistor and a load current.

* * * * *